United States Patent [19]

Go

[11] Patent Number: 4,912,545
[45] Date of Patent: Mar. 27, 1990

[54] BONDING OF ALIGNED CONDUCTIVE BUMPS ON ADJACENT SURFACES

[75] Inventor: Tiong C. Go, El Toro, Calif.
[73] Assignee: Irvine Sensors Corporation, Costa Mesa, Calif.
[21] Appl. No.: 97,797
[22] Filed: Sep. 16, 1987
[51] Int. Cl.$^4$ .................. H01L 21/447; H01L 21/441; H01L 21/44; H01L 23/54
[52] U.S. Cl. ........................................ 357/67; 228/179
[58] Field of Search ................. 228/179, 180.1, 180.2; 420/84; 357/67

[56]  References Cited

U.S. PATENT DOCUMENTS

| | | | |
|---|---|---|---|
| 4,376,505 | 3/1983 | Wojcik | 228/180.2 |
| 4,545,610 | 10/1985 | Lakritz et al. | 228/180.2 |
| 4,605,153 | 8/1986 | Van Den Brekel et al. | 228/180.2 |
| 4,673,772 | 6/1987 | Satoh et al. | 228/180.2 |
| 4,749,120 | 6/1988 | Hatada | 228/180.2 |

Primary Examiner—Rolf Hille
Assistant Examiner—S. V. Clark
Attorney, Agent, or Firm—Thomas J. Plante

[57]  ABSTRACT

A bump bonding process and product are disclosed in which both pressure and heating are used in situations where the temperature should not exceed a predetermined amount, e.g., bonding of a photoconductor array to a module containing electronic processing devices. The bonding process involves eutectic alloying of indium and bismuth, allowing welding of the bumps at a temperature substantially below the two metals' melting points. In one version of the invention, bumps on adjacent substrates are directly aligned. In another version, each bump on one substrate is wedged between a pair of bumps on the other substrate.

14 Claims, 5 Drawing Sheets

BONDING OF ALIGNED CONDUCTIVE BUMPS ON ADJACENT SURFACES

BACKGROUND OF THE INVENTION

This invention relates to the process referred to as "bump bonding" or "flip chip bonding"; and it is directed to the problem of successfully aligning and bonding a multiplicity of closely-spaced conductive bumps formed on two facing surfaces, e.g., the bonding of a substrate carrying a two-dimensional array of photodetectors to a substrate which has circuitry providing individual leads to each detector. Also, there are numerous other uses for successful bump bonding techniques.

Such a structure requires effective bonding of many individual sets of conductive bumps. Because of the presence of photodetectors, which can be damaged by temperatures above 80° C., the practice heretofore has been to bond such photodetector arrays solely by pressure (to cause the metal to cold flow), avoiding the use of heat to assist in the bonding process. It should be noted here that indium's melting point is 157.4° C.

The generally favored material used in the bonding bumps is indium. It is an effective electrical conductor; and it is relatively soft, permitting individual bumps to be "squashed" (cold flow) under pressure. This deformability of the bumps is necessary, not only to cause a mechanical bond between bumps, but also, because the opposite planar surfaces carrying the aligned bumps can only be held to a flatness tolerance of about two or three microns. In order to permit substantially all of the bump sets to engage, those which engage first must be soft enough to compensate for the lack of absolute flatness of the planar surfaces. Also, because of its softness, indium minimizes the problems caused by mismatch of thermal coefficients of expansion of the detector substrate and the substrate which has the circuitry.

Indium as the bonding material does, however, have certain deficiencies, due primarily to its tendency to oxidize readily. Indium oxide is an insulator, which tends to defeat the purpose of the bond. Also, indium oxide tends to weaken the mechanical bond between the aligned bumps. A layer of gold on top of the indium bumps has been tried by some experiments, as a means of solving the oxidation problem. However, that has failed to solve the problem because the indium tends to diffuse through the gold, so that the indium still reaches the top of the bump and oxidizes.

In some uses of flip-chip bonding methods, i.e., bonding semiconductor chips, these problems were avoided by using bonding materials other than indium, and by using relatively high temperatures to cause such materials to flow. A solder reflow process using silver or gold bumps is popular in the industry. As stated above, when photo-detectors are involved, high temperatures cannot be used safely.

SUMMARY OF THE INVENTION

The present invention has significantly improved the bump bonding process by combining the use of indium bumps with the use of heat, in addition to pressure, during bonding.

By using an alloying metal, which prevents oxidation of the indium, and which, alloyed with indium, provides a eutectic temperature below 80° C., both the oxidation problem, and the danger of heat damage of the detector material, are avoided. The preferred alloying metal for this purpose is bismuth, which combines with indium to provide an alloy having a eutectic temperature of 72° C. This temperature is substantially below the melting points of indium (157.4° C.) and bismuth (271.3° C.). The eutectic alloy is formed during the bump bonding process; and the alloying inherently provides an ideal bond.

The indium bumps are each relatively high, e.g., 10 microns, whereas the bismuth layer is very thin, e.g., 0.1 micron. The eutectic bonding goes to that depth in the indium at which the alloying ratio (eutectic point) of the two metals is reached.

The combination of pressure and heat during the alloying/bonding process facilitates the alloy formation, and attains much better bonding strength than methods using pressure only. In order to distribute the heat evenly and to avoid oxidation, the present invention uses an inert gas, preferably argon, which is heated and retained in the space between the opposed bump-carrying planar surfaces. The effect is to heat both planar surfaces and all of the indium/bismuth bumps.

Another improvement in bonding efficiency is provided by using wedge bonding, in which a single bump on one surface is forced between a pair of bumps on the other surface during the bonding process.

DETAILED DESCRIPTION OF SPECIFIC EMBODIMENTS

Figure 1A:
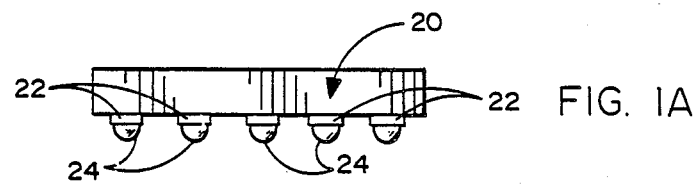
FIGS. 1A and 1B represent, respectively, a simplified structure of a photodetector-carrying focal plane substrate having on its surface a plurality of bonding bumps prior to bonding, and an electronics-containing module having on its focal plane surface a plurality of bonding bumps prior to bonding.
Figure 1B:
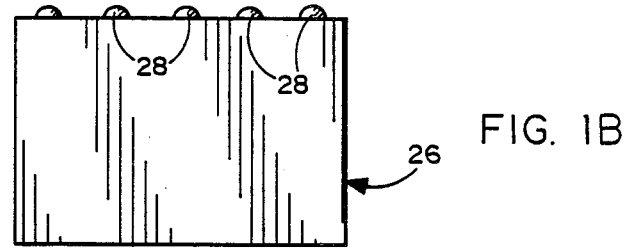
Figure 2:
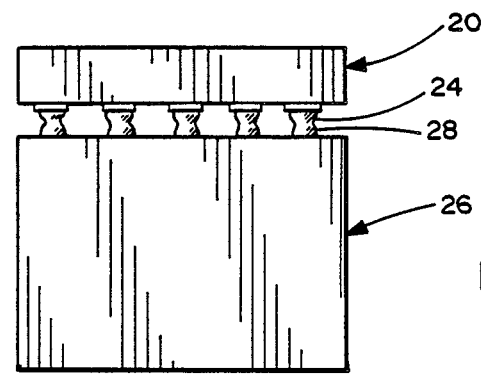
FIG. 2 shows the result of bonding the aligned bumps of FIGS. 1A and 1B.

FIGS. 1A, 1B, and 2 provide a simple illustration of bump bonding, in a structure in which the photo-detectors are "backside" illuminated. A detector-carrying substrate 20 is used, which is transparent to either infrared or shorter wavelength radiation. The incoming radiation is indicated by the arrows. On the lower side of substrate 20, a large number of separate, but closely-spaced, photo-detectors 22 may be provided by relatively thin layers of detector material, such as lead selenide (PbSe), lead sulfide (PbS), mercury cadmium teluride (HgCdTe) or indium antimonide (InSb). Each detector 22 has a conductive terminal, such as gold-nickel, formed over it, and a bump 24 of conductive material, preferably indium, deposited on the detector's conductive terminal.

An electronic module 26, which may be formed by stacking semiconductor chips, as described in Patents 4,525,921; 4,551,629; 4,646,128 and 4,672,737, has on its surface a plurality of conductive bumps 28, preferably indium, each deposited on a separate metallic terminal which has electrical contact with an individual electrical lead, which is connected to circuitry inside module 26, and which is accessible at the focal plane surface of the module.

After the bump bonding process has been completed, each pair of aligned bumps 24 and 28 will have been pushed together ("squashed"), as shown in FIG. 2, thus providing electrical contact between each individual photodetector and its electronic circuitry inside module 26, which circuitry processes separately the signal from each photodetector and then causes multiplexing of such signals, prior to communication with exterior electronic processing equipment.

Bump bonding is also valuable in numerous other situations, e.g., making individual electrical connections between conductors in a high density electronic module (such as a memory module) and electrical conductors on a module-supporting substrate.

Because of the proximity of the photo-detectors to the bonding bumps, and because of the risk of heat damage to the photo-detectors and other elements (referred to above), it has heretofore been the practice to rely solely on pressure to cause bonding in the vicinity of photo-detectors. The present invention provides a safe means of combining heat with pressure, by obtaining heat-assisted bonding at a relatively low temperature level. This is the result of a eutetic bonding process not previously suggested for this purpose.

In the complete bonding process, the first step is the forming of the indium alloy bumps 24 and 28 on the surfaces of the respective components. After the bumps have been formed, they are bonded, using a precision "bump bonding machine" which adjusts the relative positions of the two components so that the bumps are aligned, and then pushes the two components together under measured pressure. In order to maintain the desired temperature at the bumps, a heated inert gas is caused to flow between the adjacent surfaces of the two components. This provides the most effective and even distribution of the heating effect without the presence of oxygen.

In preparing the bumps 24 and 28, evaporated indium is vacuum-deposited on the component surface to the desired level. Inside the same vacuum chamber, without breaking the vacuum, the alloying metal is then vacuum-deposited on the indium surface, using a carefully controlled amount of material. The preferred alloying material is bismuth.

Various difficulties have been encountered in attempting to deposit indium bumps having the desired height of approximately 10 microns. An evaporate-through mask made of BeCu-Ni bimetal was successfully used; but the removal of the metal shadows around the bumps proved to be too cumbersome. On the other hand, the conventional process of subtractive photo-etching of metal could not be used because conductive terminals have to be deposited on the substrate prior to indium bump formation. Besides, because of their height, severe under-cutting of the bumps would make such a process useless. Instead, a single-layer lift-off process is widely used for bump formation. This process is described by Hatzakis, Canavello and Shaw of IBM in an article "Resist Modification for Optical Lift-Off Process", (Microcircuit Engineering 80: 439, 1980). This process has not been successful in completely removing the unwanted metal, due to the unusually high bumps required in this process. A two-layer technique is preferred, which produces a large amount of overhang around the top edge of the photoresist opening (the dimension of the top opening is less than the bottom window dimension). The overhang (negative sidewall profile) is a requirement for successful lift-off, which will become obvious later in the discussion. The two-layer optical lift-off process is described by B. C. Feng and G. C. Feng in U.S. Pat. No. 4,204,009 (issued May 20, 1980).

Figure 3A:
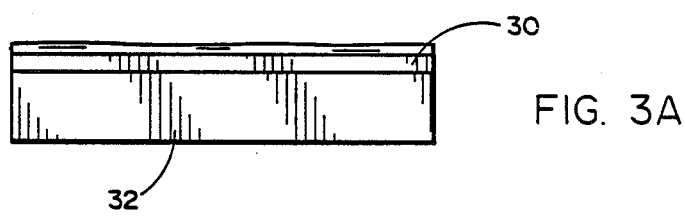
FIGS. 3A-3E show the series of steps taken in forming the bonding bumps on a supporting substrate.

FIGS. 3A to 3E show sketches of successive steps in depositing bonding bumps by a lift-off process. In FIG. 3A a two-layer positive photoresist film 30 (e.g., AZ-4620 material) is shown applied to a substrate 32 on which the bonding bumps of metal are to be formed. In order to obtain a 10 micron high metal bump, a 12 micron thick photoresist layer is required.

Figure 3B:
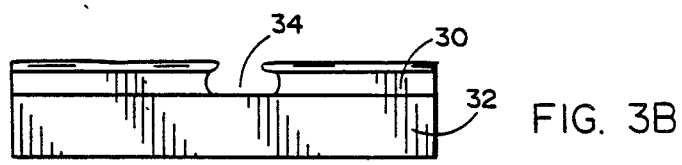

In FIG. 3B, a standard photolithography process has been used to form a plurality of windows 34 in the photoresist layer 30. This process may be either a positive or a negative photoresist process. In the present case, a positive resist has been used, in which the photomask covers the entire surface of layer 30, except where windows 34 are to be formed. Exposure to ultra-violet radiation causes "degradation" of the positive resist in the window areas. After removal of the photo-mask, these exposed windows of photoresist are washed away, using appropriate chemicals.

Figure 3C:
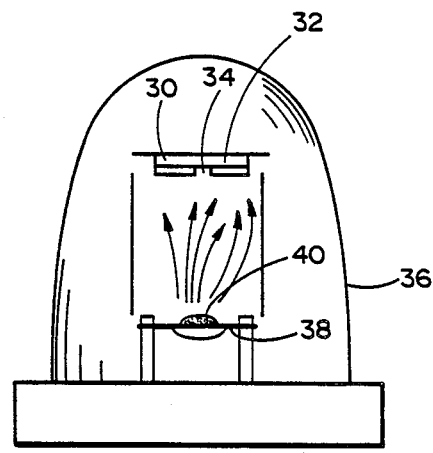

In FIG. 3C, the metal deposition process is shown. The photoresist-carrying substrate 32 is inverted, and placed inside, and near the top of, a bell jar 36. Vacuum is maintained inside bell jar 36. A metal "boat" 38 holding indium metal 40 is heated to a high temperature, causing the indium to evaporate and deposit over the entire photoresist surface, as well as in the windows 34. When the evaporated indium reaches the windows 34 and substrate 32, its temperature is sufficiently reduced to return it to its solid condition.

The metal structure, as exhibited by its surface texture, is an important factor affecting the bumps' bonding strength. Experimental results have indicated that coarse-texture bumps made stronger bonds than fine-texture bumps. The metal structure of the indium layer can be controlled by many techniques; however, a simple procedure is to control substrate temperature and deposition rate.

After the indium layer has been deposited on the substrate and photoresist, a carefully measured amount of bismuth is evaporated to form a thin layer on top of the indium.

Figure 3D:
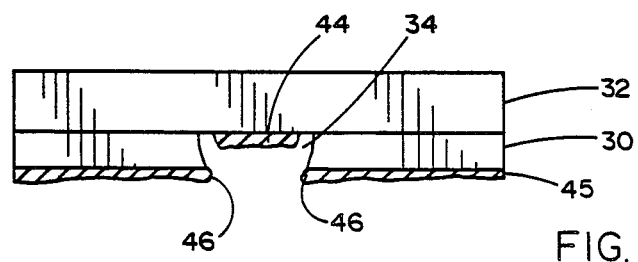
Figure 3E:
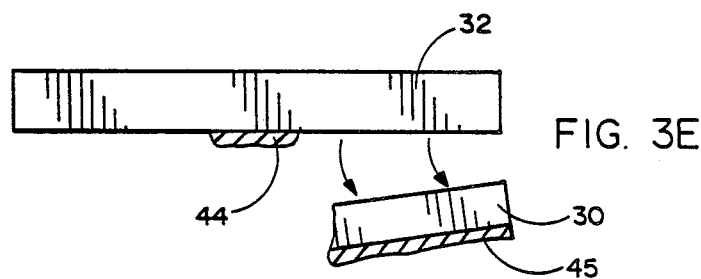

As shown in FIG. 3D, an evaporated indium/bismuth layer 44 has been deposited in the windows 34; and a metal layer 45 has also been deposited on the surface of the photoresist layer 30. At the edges 46 of the windows 34, the metal 45 on the photoresist is not connected to the metal 44 at the bottom of the opening, and layer 45 will be fully removed when the photoresist layer is removed, i.e., lifted off, as shown in FIG. 3E. This lifting off of the photoresist layer is accomplished by a chemical/mechanical process step. The entire substrate, indium, and photoresist element is placed in acetone in an ultrasonic tank. The acetone swells the photoresist; and the ultrasonic vibration facilitates lifting off the photoresist and the metal on it.

Figure 4:
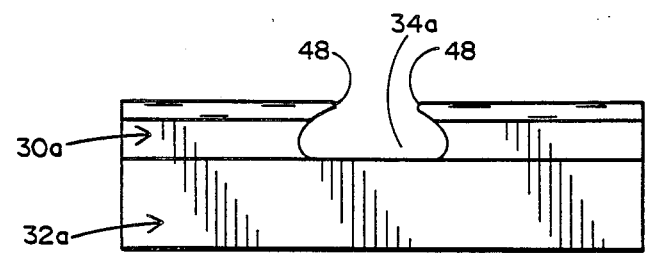
FIG. 4 shows the desired shape of the windows in the photoresist layer (on the substrate) before metal deposition.
Figure 5:
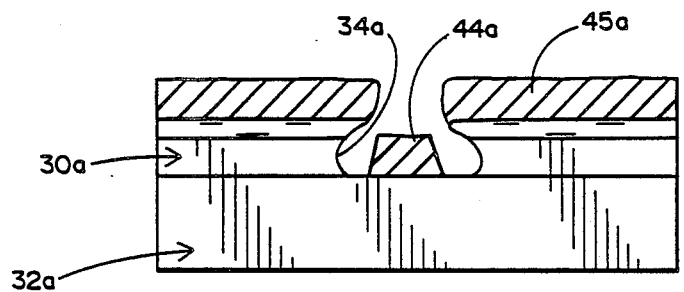
FIG. 5 shows the substrate of FIG. 4 after deposition of the metal bonding bumps, and before lift-off of the photoresist.

FIGS. 4 and 5 show more realistically, and in an enlarged form, the photoresist layers and metal bumps. FIG. 4 shows the photoresist before metal deposition and FIG. 5 shows the deposited metal before lift-off. As shown in FIG. 4, the two-layer photoresist film 30a, which is about 12 microns thick, has an overhang portion 48, which reduces the top opening into window 34a. The purpose of the overhang 48 is to permit the chemical material which removes the photoresist to get underneath the metal layer 45a deposited on top of the photoresist.

FIG. 5 shows the metal alloy bump 44a which has been deposited on substrate 32a by the vacuum deposition process. Its natural shape, as shown, is a pyramidal frustum because of the movement of the evaporated metals from the metal boat to the substrate. The metal bumps are about 10 microns high. The layer of metal alloy 45a on top of photoresist 30a is also about 10 microns thick; but the bump 44a is not connected to the layer 45a. When the photoresist is removed, the entire layer 45a is also removed. A multiplicity of separate metal bumps 44a will remain, which will be aligned with similar bumps on another substrate; and the opposed bumps will be interconnected during the subsequent bump bonding process.

Between the deposition of the indium and bismuth, and the bump bonding of the substrate 20 to module 26 (FIG. 2), it is desirable to minimize exposure of the bumps to oxygen. This can be accomplished by controlling their environment and by proceeding quickly to the bump bonding process. For example, the bump-carrying members may be stored in a nitrogen dessicator, but not for more than 24 hours before being bonded in the machine described below.

Bump bonding requires a specially designed machine, such as an aligner/bonder fabricated by Research Devices, Div. of Americal Optical Corporation, at the request of the assignee of the present application. This machine includes the following components:

(a) An upper holder, having a quartz vacuum chuck, which holds the substrate 20 (FIG. 1) with the bumps 24 facing down;

(b) A lower holder, having a leveling chuck, which supports the module 26 (FIG. 1) with the bumps 28 facing up;

(c) A bump alignment stage associated with the lower chuck which permits adjustment in the X, Y and rotation directions until the pattern of bumps on the substrate superimposes on the pattern of bumps on the module;

(d) A leveling mechanism associated with the lower chuck, which includes two adjusting micrometers. An auto-collimator is attached to the microscope to show non-parallelism of the facing surfaces of the substrate and module; the auto-collimator provides coinciding visual cross-hairs on the TV-monitor when the surfaces have been adjusted to become parallel;

(e) Means for providing predetermined pressure forcing the aligned bumps together; and (f) Means for providing uniform heat at the bumps to attain the eutectic alloying/bonding temperature.

Figure 6:
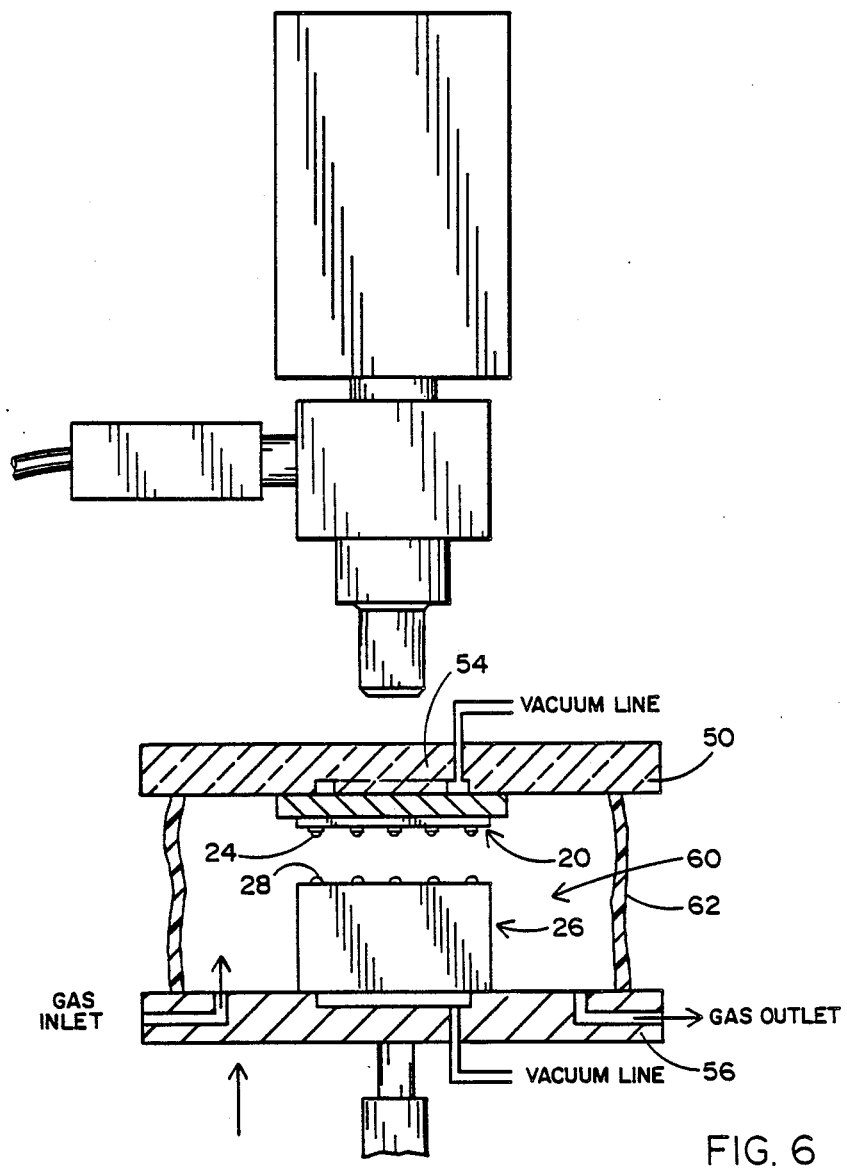
FIG. 6 shows the primary components of a bump bonding machine.

FIG. 6 shows schematically the primary components of the bump bonding machine. The substrate 20, carrying bumps 24 which face downwardly, is held by vacuum against the underside of a quartz planar chuck 50, the vacuum being developed by removal of air through a hose 52, connected to a channel 54. Because the quartz chuck 50 is transparent, it permits light traveling in the direction indicated by the arrows to be used for bump alignment purposes.

The module 26, carrying bumps 28 which face upwardly, is supported and retained in position on a lower chuck 56, which is so designed as to be adjustable for planar leveling purposes, i.e., in order to obtain planar parallelism of the two bump-carrying surfaces. The lower chuck 56, after leveling and bump alignment, is moved upward, preferably under manually increased force, to push the aligned bumps together. A pressure indicator is incorporated to measure and display the bonding force being exerted. The force is adjustable up to 25 kilograms.

It is important to provide controlled heating of the bumps to cause their eutectic bonding. Heating by gas flow is ideal because of the even heat distribution. This can be accomplished by causing gas flow through a chamber in which the bump bonding is accomplished. A rubber or plastic seal 62 prevents the entry of oxygen into chamber 60. The gas must be inert, and preferably should be relatively heavy. Argon is the preferred gas, although nitrogen would be acceptable. Helium is too light for successful functioning in this situation. Because the eutectic alloying temperature of the indium and bismuth metals in the bumps is 72° C., and because temperatures up to 80° C. are considered safe for the nearby detector materials (and other materials, such as epoxy between the chips in the module, and passivation on the focal plane of the module) the inert gas will function very effectively, if maintained at a temperature of approximately 80° C.

Experiments have indicated that a suitable force between each pair of aligned bumps is approximately 1.1 grams. In an array of 64 by 64 bumps, the total force ("pressure") required between the chucks 50 and 56 would be approximately 4.5 kilograms. Such an array might have bumps whose dimensions are: height 0.0004", and diameter 0.002"; and whose center-to-center spacings are 0.004". Pull-off tests, used to determine the strength of the bonds, have shown that pull strength of greater than 1.4 kilograms per 64×64 array has been achieved.

Figure 7:
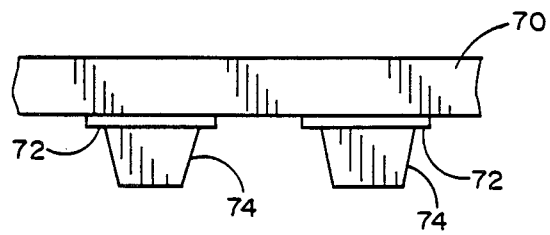
FIGS. 7 and 8 are side views of first and second bump-carrying substrates, one of which carries pairs of smaller bumps, each of which pairs provides an entry wedge for one of the larger bumps carried by the other substrate.

FIGS. 7-10 illustrate a particularly effective form of bump bonding, which has been given the descriptive designation of wedge bonding. FIG. 7 shows an upper substrate 70 having a plurality of photodetectors 72 formed on its lower surface. A eutectic indium/bismuth bonding bump 74 is bonded to each photodetector.

Figure 8:
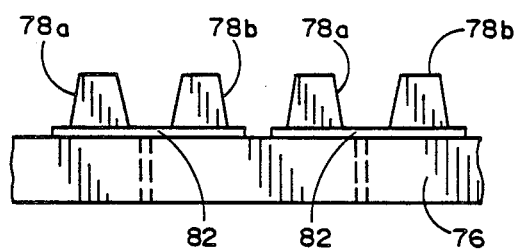

FIG. 8 shows a lower substrate 76, which is part of a module containing electrical conductors which carry signals from the individual photodetectors 72 to electronic processing devices. Instead of having a single bonding bump aligned with each bonding bump 74, substrate 76 has a plurality of pairs of bonding bumps 78a and 78b, each pair being adapted to engage, and be bonded to, one of the bonding bumps 74.

Figure 9:
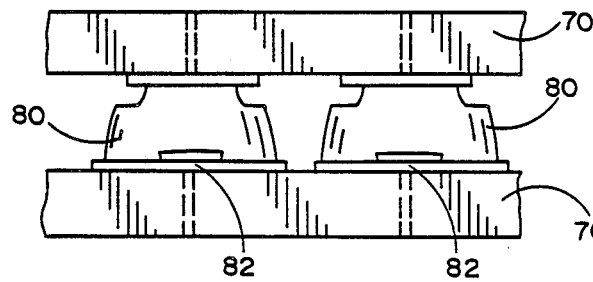
FIG. 9 shows the shape of the separate bump bonds after the bumps of FIGS. 7 and 8 have been bonded together.

During the bump bonding process, each bump 74 on substrate 70 is wedged between a pair of bumps 78a/78b on substrate 76, resulting in a final bonded structure similar to that shown in FIG. 9, in which interconnecting bonds 80 remain after the bump bonding process. Each bump 74 enters as a wedge between the paired bumps 78a/78b. This wedging process enlarges the area of bump interengagement, thus improving the electrical conductivity, and increasing the strength of the bond. There is a much larger contact area, and also a wedge locking effect. With the wedge bumping combinations, alignment accuracy of the bumps, and coplanarity of the substrates become less critical. Each pair of pumps 78a and 78b is provided with a T-shaped electrical conductor 82 leading to the underside of substrate 76.

Figure 10A:
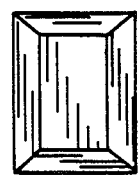
FIGS. 10A and 10B show top views of a single bump and its opposing pair of bumps before bonding.
Figure 10B:
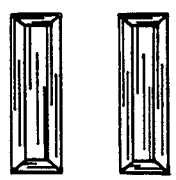

FIGS. 10A and 10B show, respectively, top views of the upper bumps 74 and the lower bump pairs 78a/78b. The longer dimension of all of the bumps may be about 50 microns; and the shorter dimensions of bumps 74 may be about 40 microns (at their bases), and of bumps 78a and 78b may be about 15 microns each (at their bases).

The bumps used in wedge bump bonding are formed in the same manner as the directly aligned bumps of the previously described embodiments.

From the foregoing description, it will be apparent that the processes and products disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. For use in bonding electrically-conductive bumps on one planar surface to electrically-conductive bumps on another planar surface, where the surfaces are in proximity to elements which necessitate a predetermined temperature limit substantially lower than usual soldering temperatures, a method comprising:
   forming a plurality of bonding bumps on each planar surface, each pump including two alloying metals having a eutectic temperature which is (a) substantially below the melting point of either alloying metal, and (b) below the predetermined temperature limit;
   adjusting the surface levels to bring them into parallelism;
   aligning the respective bonding bumps on the two surfaces;
   exerting a pressure forcing the aligned bumps together;
   simultaneously heating the bumps to at least the eutectic temperature of the alloying metals, in order to facilitate conductive engagement of the aligned bumps; and
   limiting the maximum heating temperature to a level below the predetermined temperature limit.

2. The method of claim 1 in which:
   each bump comprises a pair of alloying metals whose eutectic temperature is below 80° C.; and
   the heating temperature is controlled to avoid exceeding approximately 80° C.

3. The method of claim 2 in which each bump comprises:
   a relatively high buildup of indium material; and
   a thin layer of a different metal on top of the indium.

4. The method of claim 3 in which the thin layer on top of the indium is bismuth.

5. The method of claim 1 in which the heating of the bumps is accomplished by:
   maintaining the bumps during bonding in a substantially enclosed area; and
   flowing an inert gas through the enclosed area, the gas having a controlled temperature, and being sufficiently heavy to prevent access of oxygen to the enclosed area.

6. The method of claim 2 in which the heating of the bumps is accomplished by:
   maintaining the bumps during bonding in a substantially enclosed area; and
   flowing an inert gas into the enclosed area, such gas being maintained at a temperature slightly higher than the eutectic alloying temperature of the pair of metals in the bumps.

7. The method of claim 4 in which the heating of the bumps is accomplished by:
   maintaining the bumps during bonding in a substantially enclosed area; and
   flowing an inert gas over the bumps, such gas being maintained at a temperature between 72° C. and 80° C.

8. An electrically-conducting bump bonded structure adjacent to elements which necessitate a predetermined temperature limit, said structure comprising:
   two planar surfaces, each having a plurality of metal bonding bumps facing the other surface and aligned with the bumps thereon;
   the bonding bumps each comprising a combination of eutectic alloying metals, which cause bonding of the aligned bumps by the alloying of such metals at their eutetic temperature;
   the eutectic temperature of the alloying metals being (a) substantially below the melting point of either allowing metal, and (b) below the predetermined temperature limit.

9. The structure of claim 8 in which each bump comprises:
   a relatively large buildup of indium on the planar surface; and
   a thin layer of bismuth on top of the indium which alloys with the indium to produce an alloy bond having a depth determined by the eutectic ratio of the two metals and by their relative amounts.

10. The bump bonding method of claim 1 in which:
    a pair of bumps on one surface are aligned with a single bump on the other surface; and
    each single bump is wedged between its aligned pair of bumps during the pressure and heating which cause conductive engagement.

11. The bump bonding method of claim 2 in which:
    a pair of bumps on one surface are aligned with a single bump on the other surface; and
    each single bump is wedged between its aligned pair of bumps during the pressure and heating which cause conductive engagement.

12. The bump bonding method of claim 4 in which:
    a pair of bumps on one surface are aligned with a single bump on the other surface; and
    each single bump is wedged between its aligned pair of bumps during the pressure and heating which cause conductive engagement.

13. The electrically-conducting structure of claim 8 in which:
    the bonding bumps on one surface are provided in pairs; and
    each bonding bump on the other surface is wedged between a pair of bumps in the bonded structure.

14. The electrically-conducting structure of claim 9 in which:
    the bonding bumps on one surface are provided in pairs; and
    each bonding bump on the other surface is wedged between a pair of bumps in the bonded structure.

* * * * *